(12) United States Patent
Cho et al.

(10) Patent No.: US 9,030,262 B2
(45) Date of Patent: May 12, 2015

(54) INPUT RECEIVER CIRCUIT HAVING SINGLE-TO-DIFFERENTIAL AMPLIFIER, AND SEMICONDUCTOR DEVICE INCLUDING THE SAME

(71) Applicant: Samsung Electronics Co., Ltd., Suwon-si, Gyeonggi-do (KR)

(72) Inventors: Young-Chul Cho, Seongnam-si (KR); Yoon-Joo Eom, Hwaseong-si (KR); Young-Jin Jeon, Hwaseong-si (KR); Yong-Cheol Bae, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 53 days.

(21) Appl. No.: 13/834,132

(22) Filed: Mar. 15, 2013

(65) Prior Publication Data

US 2013/0257534 A1    Oct. 3, 2013

Related U.S. Application Data

(60) Provisional application No. 61/619,690, filed on Apr. 3, 2012.

(30) Foreign Application Priority Data

Mar. 6, 2013    (KR) .................... 10-2013-0023896

(51) Int. Cl.
*H03F 3/04*    (2006.01)
*H03F 3/45*    (2006.01)
*G11C 5/00*    (2006.01)

(52) U.S. Cl.
CPC ...... *H03F 3/45076* (2013.01); *H03F 2200/372* (2013.01); *G11C 5/00* (2013.01); *H03F 3/45183* (2013.01); *H03F 2203/45702* (2013.01)

(58) Field of Classification Search
USPC .................... 330/117, 252, 253, 301, 310
See application file for complete search history.

(56) References Cited

U.S. PATENT DOCUMENTS

| | | | |
|---|---|---|---|
| 7,671,686 B2 | 3/2010 | Kuo et al. | |
| 7,737,789 B2 * | 6/2010 | Eisenstadt et al. | 330/311 |
| 7,982,536 B2 | 7/2011 | Chao | |
| 8,125,268 B2 * | 2/2012 | Pan et al. | 327/563 |
| 8,410,856 B2 * | 4/2013 | Kuo et al. | 330/301 |
| 8,471,628 B2 * | 6/2013 | Ryat | 330/51 |
| 8,576,008 B2 * | 11/2013 | Mehrmanesh et al. | 330/282 |
| 2002/0158685 A1 | 10/2002 | Suzuki | |
| 2010/0052777 A1 | 3/2010 | Pan et al. | |
| 2010/0182093 A1 | 7/2010 | Hasegawa | |
| 2010/0329158 A1 | 12/2010 | Sengupta et al. | |

* cited by examiner

*Primary Examiner* — Khanh V Nguyen
(74) *Attorney, Agent, or Firm* — Lee & Morse, P.C.

(57) ABSTRACT

An input receiver circuit including a single-to-differential amplifier and a semiconductor device including the input receiver circuit are disclosed. The input receiver circuit includes a first stage amplifier unit and a second stage amplifier unit. The first stage amplifier unit amplifies a single input signal in a single-to-differential mode to generate a differential output signal, without using a reference voltage. The second stage amplifier unit amplifies the differential output signal in a differential-to-single mode to generate a single output signal.

18 Claims, 10 Drawing Sheets

US 9,030,262 B2

INPUT RECEIVER CIRCUIT HAVING SINGLE-TO-DIFFERENTIAL AMPLIFIER, AND SEMICONDUCTOR DEVICE INCLUDING THE SAME

CROSS-REFERENCE TO RELATED APPLICATION

This application claims the benefit of provisional U.S. application No. 61/619,690, filed on Apr. 3, 2012, and also claims priority under 35 U.S.C. §119 to Korean Patent Application No. 10-2013-0023896 filed on Mar. 6, 2013, the disclosure of which is hereby incorporated by reference in its entirety.

BACKGROUND

1. Field

Embodiments of the inventive concepts relate to semiconductor devices, and particularly to an input receiver circuit including a single-to-differential amplifier, and a semiconductor memory device including the input receiver circuit.

2. Description of Related Art

A semiconductor device, e.g. a semiconductor memory device, generally includes an input/output circuit. Such an input/output circuit usually includes an input receiver circuit for converting a signal, which is input from the external, into a signal that is compatible with an internal circuit.

SUMMARY

Embodiments of the inventive concept provide an input receiver circuit operating smaller power consumption and higher operating speed.

Embodiments of the inventive concept also provide a semiconductor memory device including the input receiver circuit.

In accordance with an aspect of the inventive concept, the input receiver circuit includes a first stage amplifier unit and a second stage amplifier unit. The first stage amplifier unit amplifies a single input signal in a single-to-differential mode to generate a differential output signal, without using a reference voltage. The second stage amplifier unit amplifies the differential output signal in a differential-to-single mode to generate a single output signal.

In an embodiment, the first stage amplifier unit may include a common-source amplifier and a common-gate amplifier. The common-source amplifier receives an input voltage signal at a gate terminal, amplifies the input voltage signal, and outputs the amplified voltage signal from a drain terminal. The common-gate amplifier receives the input voltage signal at a source terminal (or a drain terminal), amplifies the input voltage signal, and outputs the amplified voltage signal from a drain terminal (or a source terminal).

In an embodiment, the common-source amplifier may include a PMOS transistor configured to receive the input voltage signal at a gate terminal, and output the amplified voltage signal from a drain terminal.

In an embodiment, the common-source amplifier may include an NMOS transistor configured to receive the input voltage signal at a gate terminal, and output the amplified voltage signal from a drain terminal.

In an embodiment, the common-gate amplifier may include a PMOS transistor configured to have a gate terminal connected to a ground voltage, and receive the input voltage signal at a source terminal to output the amplified voltage signal from a drain terminal.

In an embodiment, the common-gate amplifier may include a PMOS transistor and an NMOS transistor. The PMOS transistor has a gate terminal connected to a ground voltage, and receives the input voltage signal at a source terminal to output the amplified voltage signal from a drain terminal. The NMOS transistor has a gate terminal connected to a supply voltage, and receives the input voltage signal at a drain terminal to output the amplified voltage signal from a source terminal.

In an embodiment, the PMOS transistor and the NMOS transistor may be connected in a transmission-gate form.

In accordance with an aspect of the inventive concept, a semiconductor memory device includes a memory cell array configured to operate in response to a word-line enable signal and a column selecting signal, a row decoder configured to decode a row address signal to generate the word-line enable signal, a column decoder configured to decode a column address signal to generate the column selecting signal, and an input/output circuit including an input receiver circuit. The input/output circuit includes a first stage amplifier unit and a second stage amplifier unit. The first stage amplifier unit amplifies a single input signal in a single-to-differential mode to generate a differential output signal, without using a reference voltage. The second stage amplifier unit amplifies the differential output signal in a differential-to single mode to generate a single output signal.

The input receiver circuit according to embodiments of the inventive concepts may include a first stage amplifier that includes a common-source amplifier and a common-gate amplifier, and performs amplification in a single-to-differential amplification mode. Therefore, the semiconductor memory device including the input receiver circuit may have small power consumption and may operate with high speed.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Figure 1:
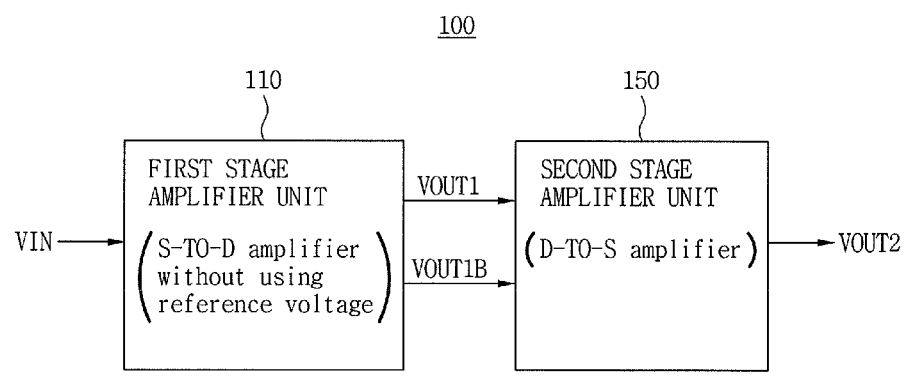
FIG. 1 is a block diagram illustrating an input receiver circuit, in accordance with an embodiment of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of an input receiver circuit 100, in accordance with an embodiment of the inventive concept.

Referring to FIG. 1, the input receiver circuit 100 includes a first stage amplifier unit 110 and a second stage amplifier unit 150. The first stage amplifier unit 110 amplifies a single input signal VIN in a single-to-differential mode to generate differential output signals VOUT1 and VOUT1B, without using a reference voltage. The second stage amplifier unit 150 amplifies the differential output signals VOUT1 and VOUT1B in a differential-to-single mode to generate a single output signal VOUT2.

As described hereinafter, input receiver circuit 100 includes a first stage amplifier unit 110 that includes a common-source amplifier and a common-gate amplifier, and performs amplification in a single-to-differential amplification mode. Therefore, the semiconductor memory device including the input receiver circuit 100 is operable with smaller power consumption and higher speed.

FIGS. 2 to 8 are circuit diagrams illustrating a first stage amplifier unit 110 included in the input receiver circuit 100 of FIG. 1, in accordance with embodiments of the inventive concepts.

Figure 2:
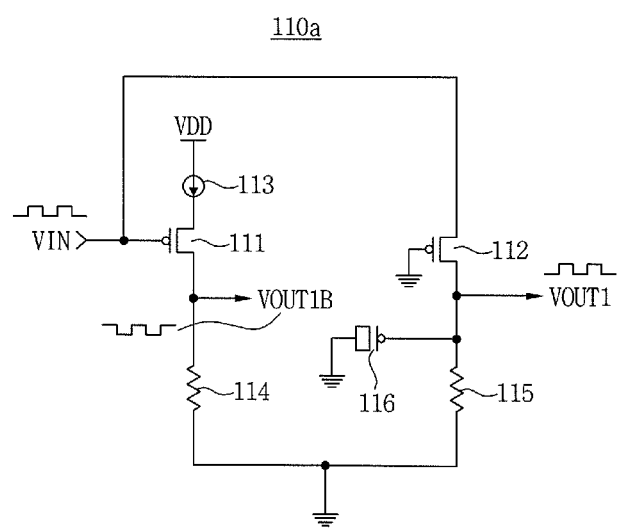
FIGS. 2 to 8 are circuit diagrams illustrating a first stage amplifier unit included in the input receiver circuit of FIG. 1, in accordance with embodiments of the inventive concepts.

Referring to FIG. 2, a first stage amplifier unit 110a may include a common-source amplifier and a common-gate amplifier. The common-source amplifier receives an input voltage signal VIN at a gate terminal, amplifies the input voltage signal VIN, and outputs the amplified voltage signal from a drain terminal. The common-gate amplifier receives the input voltage signal VIN at a first terminal (source or drain terminal), amplifies the input voltage signal VIN, and outputs the amplified voltage signal from a second terminal (drain or source terminal).

The first stage amplifier unit 110a may include a first PMOS transistor 111, a first current source 113, a first resistor 114, a second PMOS transistor 112, and a second resistor 115. The first PMOS transistor 111, the first current source 113, and the first resistor 114 may form the common-source amplifier, and the second PMOS transistor 112 and the second resistor 115 may form the common-gate amplifier.

The first PMOS transistor 111 receives the input voltage signal VIN at a gate terminal, and amplifies the input voltage signal VIN to output a first output voltage signal VOUT1B from a drain terminal. The current source 113 is connected between a supply voltage VDD and the first PMOS transistor 111, and supplies a current to a source terminal of the first PMOS transistor 111. The first resistor 114 is connected between the drain terminal of the first PMOS transistor 111 and a ground voltage, and provides a load to the first PMOS transistor 111. The second PMOS transistor 112 has a gate terminal connected to the ground voltage. The second PMOS transistor 112 receives the input voltage signal VIN at a source terminal, and amplifies the input voltage signal VIN to output a second output voltage signal VOUT1 from a drain terminal. The first output voltage signal VOUT1B and the second output voltage signal VOUT1 may have opposite phases from each other. The first output voltage signal VOUT1B may have an opposite phase from the input voltage signal VIN. The second output voltage signal VOUT1 may have a same phase as the input voltage signal VIN. The second resistor 115 is connected between the drain terminal of the second PMOS transistor 112 and the ground voltage. The first stage amplifier unit 110a may further include a capacitor 116 connected between the drain terminal of the second PMOS transistor 112 and the ground voltage. The capacitor 116 may be a MOS capacitor that uses capacitance between a gate terminal of a MOS transistor, in which a source terminal and a drain terminal are electrically connected to each other, and the ground voltage.

Figure 3:
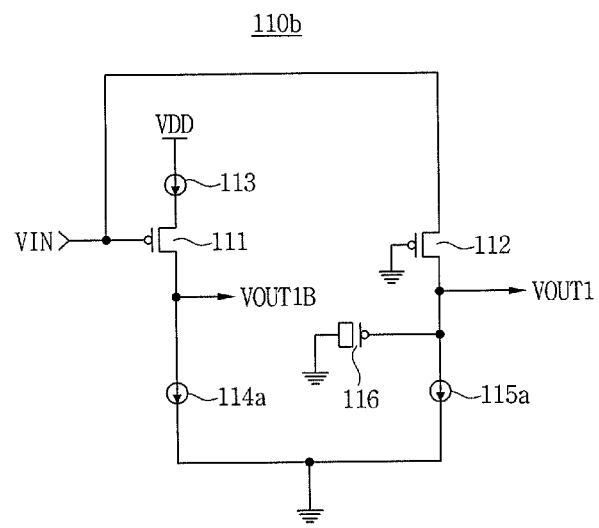

Referring to FIG. 3, a first stage amplifier unit 110b may include the first PMOS transistor 111, the first current source 113, a second current source 114a, the second PMOS transistor 112, and a third current source 115a. The first PMOS transistor 111, the first current source 113, and the second current source 114a may form the common-source amplifier, and the second PMOS transistor 112 and the third current source 115a may form the common-gate amplifier.

The first PMOS transistor 111 receives the input voltage signal VIN at a gate terminal, and amplifies the input voltage signal VIN to output a first output voltage signal VOUT1B from a drain terminal. The first current source 113 is connected between a supply voltage VDD and the first PMOS transistor 111, and supplies a current to a source terminal of the first PMOS transistor 111. The second current source 114a is connected between the drain terminal of the first PMOS transistor 111 and a ground voltage, and provides a load to the first PMOS transistor 111. The second PMOS transistor 112 has a gate terminal connected to the ground voltage. The second PMOS transistor 112 receives the input voltage signal VIN at a source terminal, amplifies the input voltage signal VIN to output a second output voltage signal VOUT1 from a drain terminal. The first output voltage signal VOUT1B and the second output voltage signal VOUT1 may have opposite phases from each other. The third current source 115a is connected between the drain terminal of the second PMOS transistor 112 and the ground voltage. The first stage amplifier unit 110b may further include the capacitor 116 connected between the drain terminal of the second PMOS transistor 112 and the ground voltage.

Figure 4:
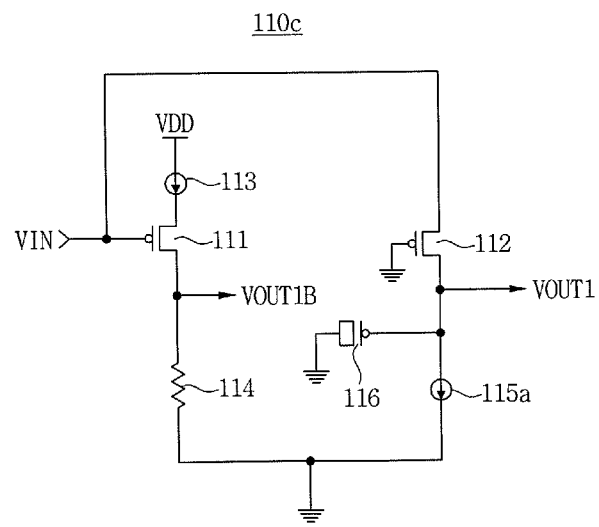

Referring to FIG. 4, a first stage amplifier unit 110c may include the first PMOS transistor 111, the first current source 113, the resistor 114, the second PMOS transistor 112, and the second current source 115a. The first PMOS transistor 111, the first current source 113, and the resistor 114 may form the common-source amplifier, and the second PMOS transistor 112 and the second current source 115a may form the common-gate amplifier.

The first PMOS transistor 111 receives the input voltage signal VIN at a gate terminal, and amplifies the input voltage signal VIN to output a first output voltage signal VOUT1B from a drain terminal. The first current source 113 is connected between a supply voltage VDD and the first PMOS transistor 111, and supplies a current to a source terminal of the first PMOS transistor 111. The resistor 114 is connected between the drain terminal of the first PMOS transistor 111 and a ground voltage, and provides a load to the first PMOS transistor 111. The second PMOS transistor 112 has a gate terminal connected to the ground voltage. The second PMOS transistor 112 receives the input voltage signal VIN at a source terminal, and amplifies the input voltage signal VIN to output a second output voltage signal VOUT1 from a drain terminal. The first output voltage signal VOUT1B and the second output voltage signal VOUT1 may have opposite phases from each other. The second current source 115a is connected between the drain terminal of the second PMOS transistor 112 and the ground voltage. The first stage amplifier unit 110c may further include the capacitor 116 connected between the drain terminal of the second PMOS transistor 112 and the ground voltage.

Figure 5:
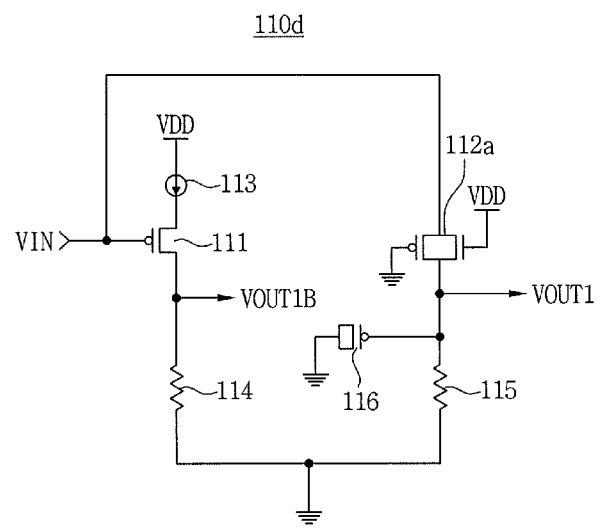

Referring to FIG. 5, a first stage amplifier unit 110d may include a first PMOS transistor 111, a current source 113, a first resistor 114, a transmission gate 112a, and a second resistor 115. The first PMOS transistor 111, the current source 113 and the first resistor 114 may form the common-source amplifier, and the transmission gate 112a and the second resistor 115 may form the common-gate amplifier.

The first PMOS transistor 111 receives the input voltage signal VIN from a gate terminal, and amplifies the input voltage signal VIN to output a first output voltage signal VOUT1B to a drain terminal. The current source 113 is connected between a supply voltage VDD and the first PMOS transistor 111, and supplies a current to a source terminal of the first PMOS transistor 111. The first resistor 114 is connected between the drain terminal of the first PMOS transistor 111 and a ground voltage, and provides a load to the first PMOS transistor 111. The transmission gate 112a amplifies the input voltage signal VIN to generate the second output voltage signal VOUT1. The transmission gate 112a may include a second PMOS transistor having a gate terminal connected to the ground voltage and an NMOS transistor having a gate terminal connected to the supply voltage VDD. The second resistor 115 is connected between the drain terminal of the second PMOS transistor included in the transmission gate 112a and the ground voltage. The first stage amplifier unit 110d may further include the capacitor 116 connected between the drain terminal of the second PMOS transistor included in the transmission gate 112a and the ground voltage.

Figure 6:
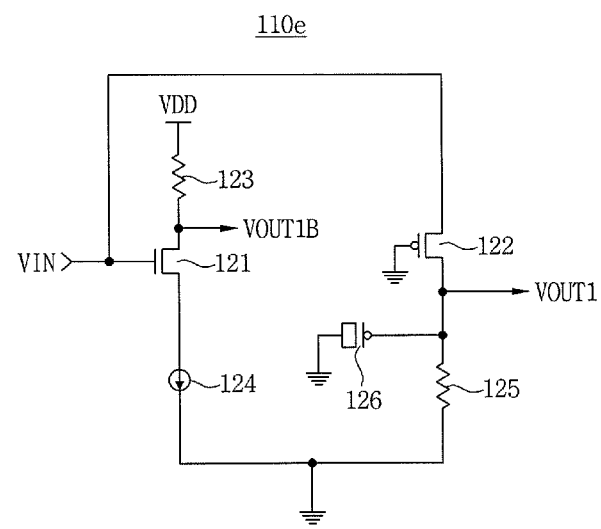

Referring to FIG. 6, a first stage amplifier unit 110e may include an NMOS transistor 121, a first resistor 123, a first current source 124, a PMOS transistor 122, and a second resistor 125. The NMOS transistor 121, the first resistor 123, and the current source 124 may form the common-source amplifier, and the PMOS transistor 122 and the second resistor 125 may form the common-gate amplifier.

The NMOS transistor 121 receives the input voltage signal VIN at a gate terminal, and amplifies the input voltage signal VIN to output a first output voltage signal VOUT1B from a drain terminal. The first resistor 123 is connected between the supply voltage VDD and the drain terminal of the NMOS transistor 121. The first current source 124 is connected between a source terminal of the NMOS transistor 121 and the ground voltage. The PMOS transistor 122 has a gate terminal connected to the ground voltage. The PMOS transistor 122 receives the input voltage signal VIN at a source terminal, and amplifies the input voltage signal VIN to output a second output voltage signal VOUT1 from a drain terminal. The first output voltage signal VOUT1B and the second output voltage signal VOUT1 may have opposite phases from each other. The first output voltage signal VOUT1B may have an opposite phase from the input voltage signal VIN. The second output voltage signal VOUT1 may have the same phase with the input voltage signal VIN. The second resistor 125 is connected between the drain terminal of the PMOS transistor 122 and the ground voltage. The first stage amplifier unit 110e may further include a capacitor 126 connected between the drain terminal of the PMOS transistor 122 and the ground voltage. The capacitor 126 may be a MOS capacitor that uses capacitance between a gate terminal of a MOS transistor, in which a source terminal and a drain terminal are electrically connected to each other, and the ground voltage.

Figure 7:
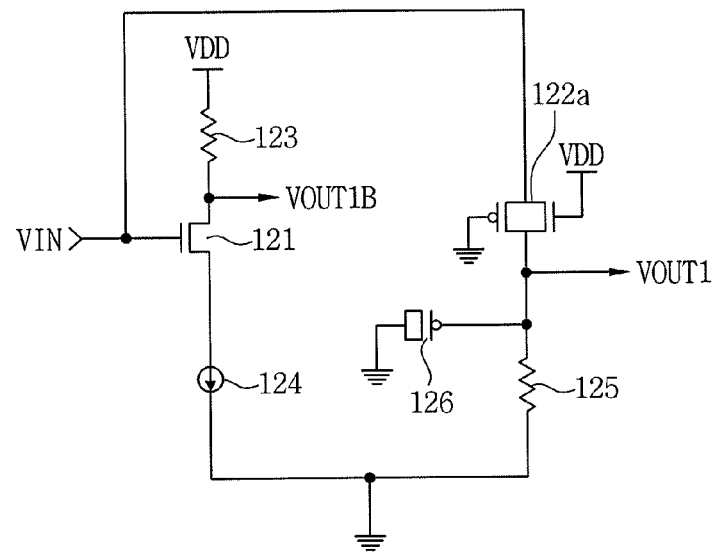

Referring to FIG. 7, a first stage amplifier unit 110f may include the first NMOS transistor 121, the first resistor 123, the first current source 124, a transmission gate 122a, and the second resistor 125. The first NMOS transistor 121, the first resistor 123, and the current source 124 may form the common-source amplifier, and the transmission gate 122a and the second resistor 125 may form the common-gate amplifier.

The first NMOS transistor 121 receives the input voltage signal VIN at a gate terminal, and amplifies the input voltage signal VIN to output a first output voltage signal VOUT1B from a drain terminal. The first resistor 123 is connected between the supply voltage VDD and the drain terminal of the first NMOS transistor 121. The first current source 124 is connected between a source terminal of the NMOS transistor 121 and the ground voltage. The transmission gate 122a amplifies the input voltage signal VIN to generate the second output voltage signal VOUT1. The transmission gate 122a may include a PMOS transistor having a gate terminal connected to the ground voltage and a second NMOS transistor having a gate terminal connected to the supply voltage VDD. The second resistor 125 is connected between the drain terminal of the PMOS transistor included in the transmission gate 122a and the ground voltage. The first stage amplifier unit 110f may further include the capacitor 126 connected between the drain terminal of the PMOS transistor included in the transmission gate 122a and the ground voltage.

Figure 8:
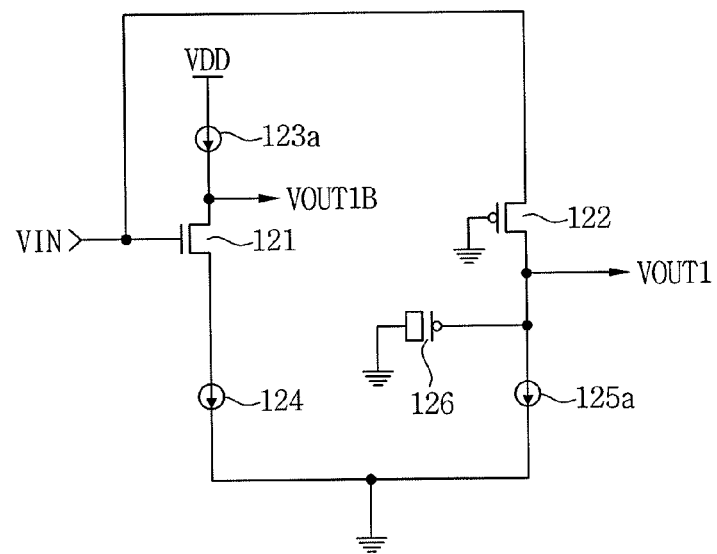

Referring to FIG. 8, a first stage amplifier unit 110g may include the NMOS transistor 121, a second current source 123a, the first current source 124, the PMOS transistor 122, and a third current source 125a. The NMOS transistor 121, the second current source 123a, and the first current source 124 may form the common-source amplifier, and the PMOS transistor 122 and the third current source 125a may form the common-gate amplifier.

The NMOS transistor 121 receives the input voltage signal VIN at a gate terminal, and amplifies the input voltage signal VIN to output a first output voltage signal VOUT1B from a drain terminal. The second current source 123a is connected between the supply voltage VDD and the drain terminal of the NMOS transistor 121. The first current source 124 is connected between a source terminal of the NMOS transistor 121 and the ground voltage. The PMOS transistor 122 has a gate terminal connected to the ground voltage. The PMOS transistor 122 receives the input voltage signal VIN at a source terminal, and amplifies the input voltage signal VIN to output a second output voltage signal VOUT1 from a drain terminal. The third current source 125a is connected between the drain terminal of the PMOS transistor 122 and the ground voltage. The first stage amplifier unit 110g may further include the capacitor 126 connected between the drain terminal of the PMOS transistor 122 and the ground voltage.

As described above, input receiver circuit 100 may include a first stage amplifier 110 that includes a common-source amplifier and a common-gate amplifier, and performs amplification in a single-to-differential amplification mode. Therefore, the semiconductor memory device including the input receiver circuit 100 may have small power consumption and may operate with high speed.

Figure 9:
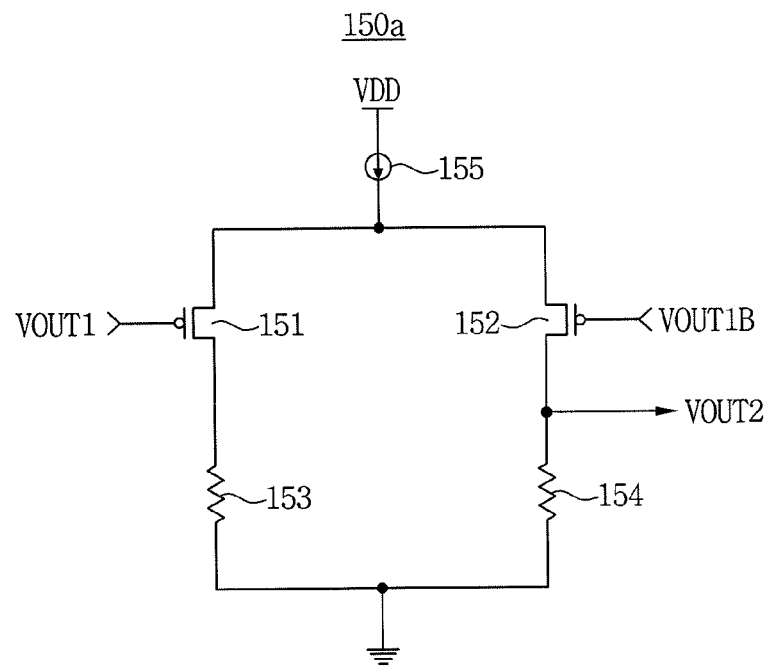
FIGS. 9 and 10 are circuit diagrams illustrating a second stage amplifier unit included in the input receiver circuit of FIG. 1, in accordance with embodiments of the inventive concepts.
Figure 10:
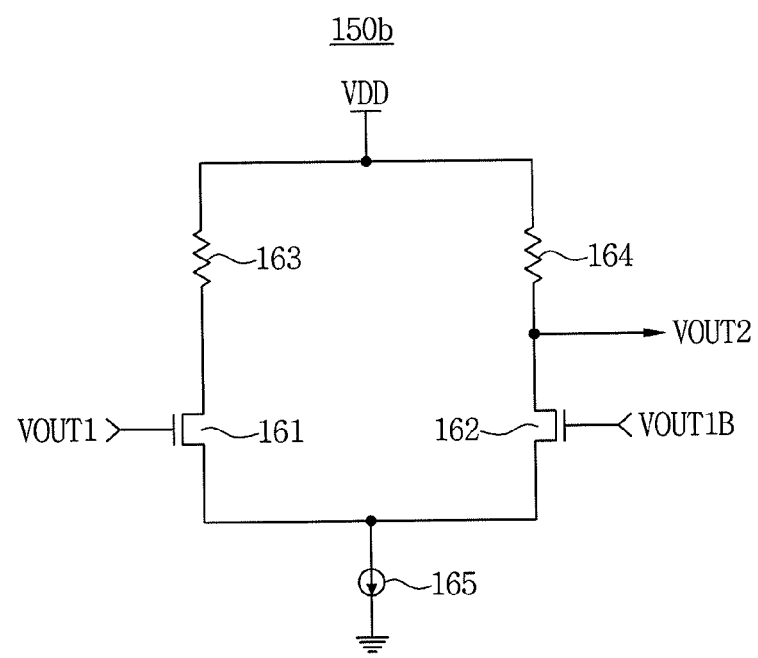

FIGS. 9 and 10 are circuit diagrams illustrating a second stage amplifier unit 150 included in the input receiver circuit of FIG. 1, in accordance with embodiments of the inventive concepts Referring to FIG. 9, a second stage amplifier unit 150a may include a first PMOS transistor 151 having a gate terminal to which the second output voltage signal VOUT1 is applied, a second PMOS transistor 152 having a gate terminal to which the first output voltage signal VOUT1B is applied, a current source 155 connected to the supply voltage VDD and source terminals of the first and second PMOS transistors 151 and 152, a first resistor 153 connected between a drain terminal of the first PMOS transistor 151 and the ground voltage, and a second resistor 154 connected between a drain terminal of the first PMOS transistor 152 and the ground voltage. The first output voltage signal VOUT1B and the second output voltage signal VOUT1 may have opposite phases from each other. The second stage amplifier unit 150a of FIG. 9 includes PMOS transistors 151 and 152, and amplifies a voltage gap between the two output voltage signals VOUT1 and VOUT1B to generate a single output voltage signal VOUT2.

Referring to FIG. 10, a second stage amplifier unit 150b may include a first NMOS transistor 161 having a gate terminal to which the second output voltage signal VOUT1 is applied, a second NMOS transistor 162 having a gate terminal to which the first output voltage signal VOUT1B is applied, a first resistor 163 connected between the supply voltage VDD and a drain terminal of the first NMOS transistor 161, and a second resistor 164 connected between the supply voltage VDD and a drain terminal of the second NMOS transistor 162, and a current source 165 connected to the source terminals of the first and second NMOS transistors 161 and 162 and the ground voltage. The second stage amplifier unit 150b of FIG. 10 includes the NMOS transistors 161 and 162, and amplifies a voltage gap between the two output voltage signals VOUT1 and VOUT1B to generate a single output voltage signal VOUT2.

Figure 11:
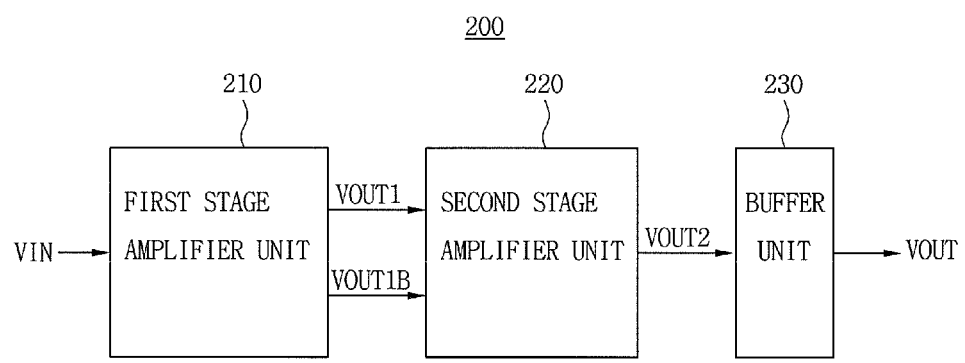
FIG. 11 is a block diagram of an input receiver circuit, in accordance with another embodiment of the inventive concept.

FIG. 11 is a block diagram of an input receiver circuit 200, in accordance with another embodiment of the inventive concept.

Referring to FIG. 11, the input receiver circuit 200 includes a first stage amplifier unit 210, a second stage amplifier unit 220, and a buffer unit 230. The first stage amplifier unit 210 amplifies a single input signal YIN in a single-to-differential mode to generate a differential output signal VOUT1 and VOUT1B, without using a reference voltage. The second stage amplifier unit 220 amplifies the differential output signal VOUT1 and VOUT1B in a differential-to-single mode to generate a single output signal VOUT2. The buffer unit 230 buffers the single output signal VOUT2 to generate a voltage signal VOUT that can be used for various function circuits in a semiconductor device.

Figure 12:
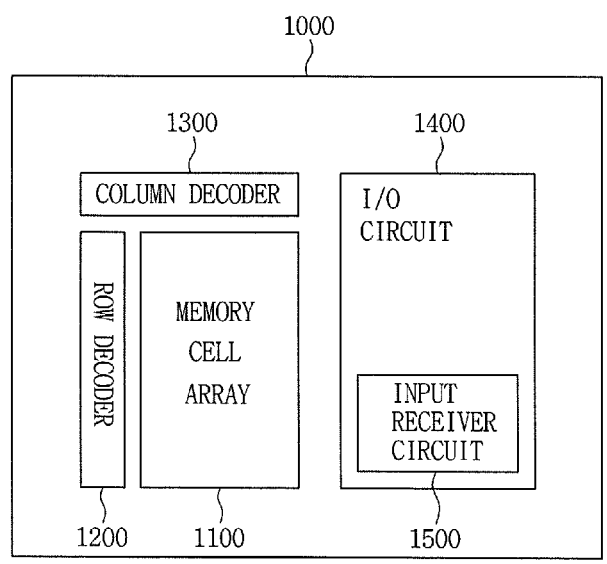
FIG. 12 is a block diagram illustrating a semiconductor memory device including input receiver circuits according to embodiments of the inventive concepts.

FIG. 12 is a block diagram illustrating a semiconductor memory device 1000 including input receiver circuits according to embodiments of the inventive concepts.

Referring to FIG. 12, the semiconductor memory device 1000 may include a memory cell array 1100, a row decoder 1200, a column decoder 1300 and an input/output circuit 1400.

The row decoder 1200 decodes a row address signal to generate the word-line enable signal. The column decoder 1300 decodes a column address signal to generate a column selecting signal. The memory cell array 1100 operates in response to the word-line enable signal and the column selecting signal.

The input/output circuit 1400 may include the input receiver circuit according to embodiments of the inventive concepts. Therefore, the input receiver circuit 1500 of the input/output circuit 1400 may include a first stage amplifier unit and a second stage amplifier unit. The first stage amplifier unit amplifies a single input signal in a single-to-differential mode to generate a differential output signal, without using a reference voltage. The second stage amplifier unit amplifies the differential output signal in a differential-to-single mode to generate a single output signal.

The semiconductor memory device 1000 of FIG. 12 may include a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination thereof.

Figure 13:
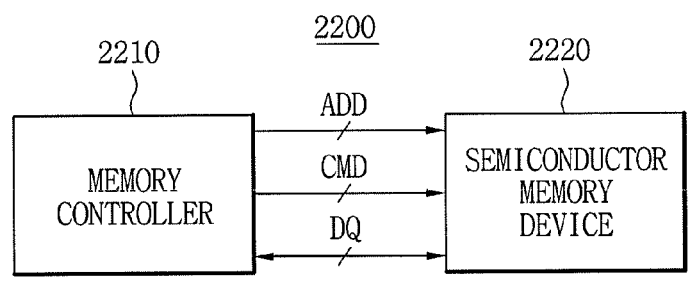
FIG. 13 is a block diagram illustrating a memory system including a semiconductor memory device according to embodiments of the inventive concepts.

FIG. 13 is a block diagram illustrating a memory system 2200 including a semiconductor memory device according to embodiments of the inventive concepts.

Referring to FIG. 13, the memory system 2200 includes a memory controller 2210 and a semiconductor memory device 2220.

The memory controller 2210 generates address signals ADD and command signals CMD, and provides the address signals ADD and the command signals CMD to the semiconductor memory device 2220 through buses. Data DQ are transmitted from the memory controller 2210 to the semiconductor memory device 2220 through the buses, or are transmitted from the stacked semiconductor memory device 2220 to the memory controller 2210 through the buses.

The semiconductor memory device 2220 may be a semiconductor memory device including the input receiver circuit according to embodiments of the inventive concepts. Therefore, the input receiver circuit of the semiconductor memory device 2220 may include a first stage amplifier unit and a second stage amplifier unit. The first stage amplifier unit amplifies a single input signal in a single-to-differential mode to generate a differential output signal, without using a reference voltage. The second stage amplifier unit amplifies the differential output signal in a differential-to single mode to generate a single output signal.

Figure 14:
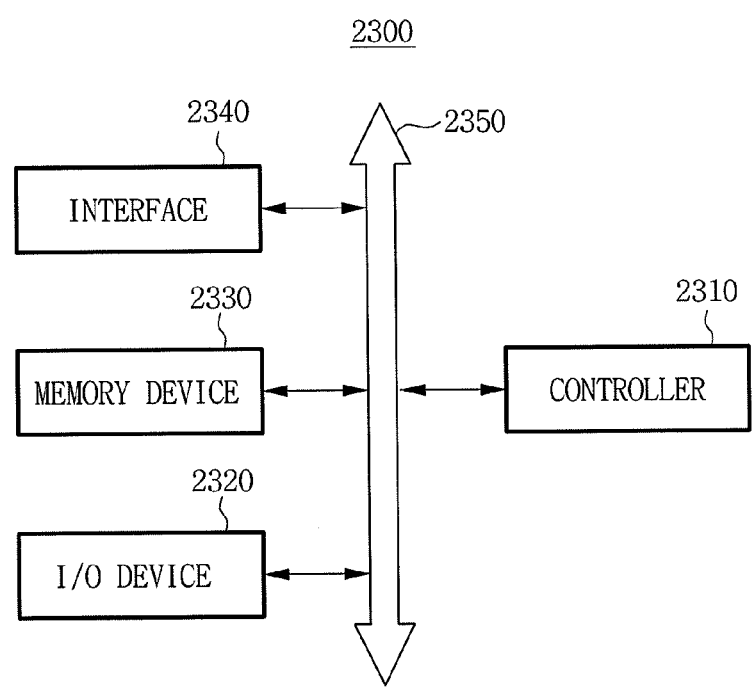
FIG. 14 is a block diagram illustrating an electronic system including a semiconductor memory device according to embodiments of the inventive concepts.

FIG. 14 is a block diagram illustrating an electronic system 2300 including a semiconductor memory device according to embodiments of the inventive concepts.

Referring to FIG. 14, the electronic system 2300 in accordance with embodiment may include a controller 2310, an input and output device 2320, a memory device 2330, an interface 2340, and a bus 2350. The memory device 2330 may be a semiconductor memory device including the input receiver circuit according to embodiments of the inventive concepts. The bus 2350 may function to provide a path through which data are mutually transferred among the controller 2310, the input and output device 2320, the memory device 2330, and the interface 2340.

The controller 2310 may include any one of logic devices that can perform functions of at least one of a microprocessor, a digital signal processer, and a microcontroller, or functions similar to those. The input and output device 2320 may include at least one of a key pad, key board, a display device, and so forth. The memory device 330 may function to store data and/or instructions executed by the controller 2310.

The memory device 2330 may include a volatile memory chip such as a dynamic random access memory (DRAM) and a static random access memory (SRAM), a non-volatile memory chip such as a flash memory, a phase change memory, a magnetic random access memory (MRAM), a resistive random access memory (RRAM), or a combination thereof.

The memory device 2330 may be a semiconductor memory device including the input receiver circuit according to embodiments of the inventive concepts. The interface 2340 may function to transmit/receive data to/from a communication network. The interface 2340 can include an antenna, wired or wireless transceivers, or the like to transmit and receive data by wires or wirelessly. In addition, the interface 2340 can include optical fibers to transmit and receive data through the optical fibers. The electronic system 2300 may be further provided with an application chipset, a camera image processor, and an input and output device.

The electronic system 2300 may be implemented as a mobile system, a personal computer, an industrial computer, or a logic system with various functions. For example, the mobile system may be any one of a personal digital assistant (PDA), a portable computer, a web tablet, a mobile phone, a wireless phone, a laptop computer, a memory card, a digital music system, and an information transmitting/receiving system. If the electronic system 2300 is an apparatus that can perform wireless communication, the electronic system 2300 may be used in a communication system such as a Code Division multiple Access (CDMA), a Global System for Mobile communication (GSM), a North American Digital Cellular (NADC), an Enhanced-Time Division Multiple Access (E-TDMA), a Wideband Code Division Multiple Access (WCDMA), or a CDMA 2000.

Figure 15:
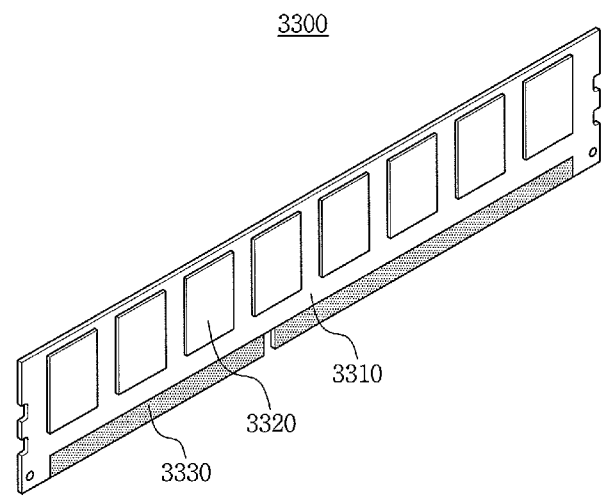
FIGS. 15 to 17 are diagrams illustrating memory modules including a semiconductor memory device according to embodiments of the inventive concepts.
Figure 16:
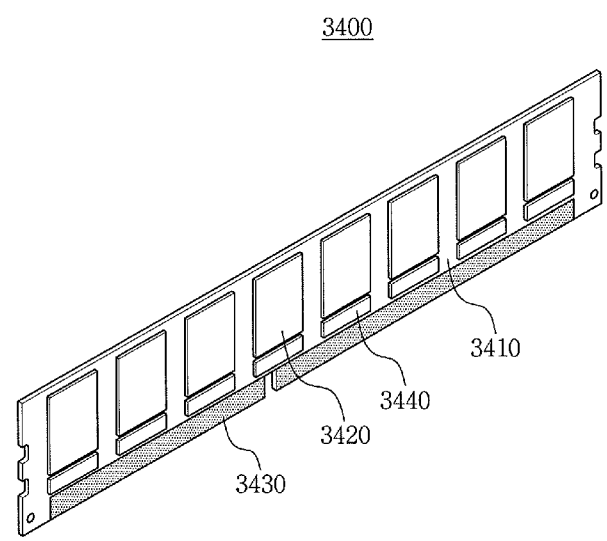
Figure 17:
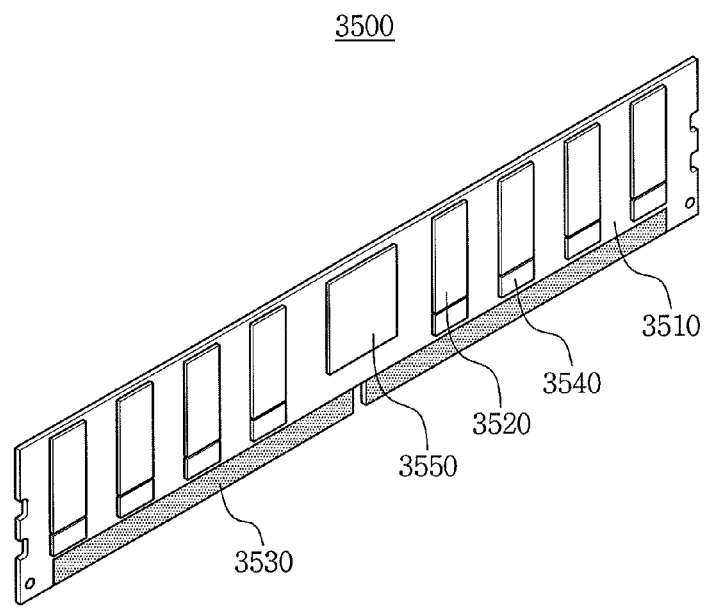

FIGS. 15 to 17 are diagrams illustrating memory modules 3300, 3400 and 3500 including a semiconductor memory device according to embodiments of the inventive concepts.

Referring to FIG. 15, the memory module 3300 includes a printed circuit board (PCB) 3310, a plurality of semiconductor memory devices 3320, and a connector 3330. The plurality of semiconductor memory devices 3320 may be bonded to the top and bottom surfaces of the PCB 3310. The connector 3330 is electrically connected to the plurality of semiconductor memory devices 3320 through conductive lines (not shown). Also, the connector 3330 may be connected to a slot of an external host.

Referring to FIG. 16, the memory module 3400 includes a PCB 3410, a plurality of semiconductor memory devices 3420, a connector 3430, and a plurality of buffers 3440. Each of the plurality of buffers 3440 may be disposed between the corresponding one of the semiconductor memory devices 3420 and the connector 3430.

The semiconductor memory devices 3420 and the buffers 3440 may be provided on the top and bottom surfaces of the PCB 3410. The semiconductor memory devices 3420 and the buffers 3440 formed on the top and bottom surfaces of the PCB 3410 may be connected through a plurality of via holes.

Referring to FIG. 17, the memory module 3500 includes a PCB 3510, a plurality of semiconductor memory devices 3520, a connector 3530, a plurality of buffers 3540, and a controller 3550.

The semiconductor memory devices 3520 and the buffers 3540 may be provided on the top and bottom surfaces of the PCB 3510. The semiconductor memory devices 3520 and the buffers 3540 formed on the top and bottom surfaces of the PCB 3510 may be connected through a plurality of via holes.

Figure 18:
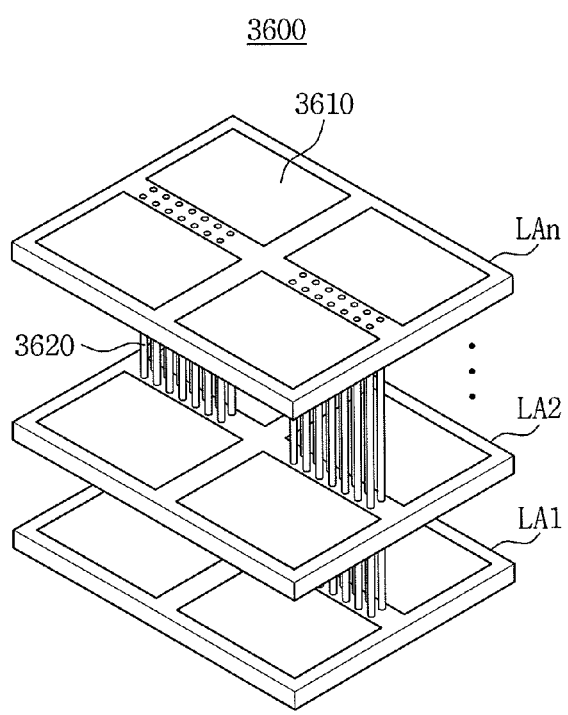
FIG. 18 is a perspective view illustrating a stacked semiconductor device including a semiconductor memory device in accordance with embodiments of the inventive concepts.

FIG. 18 is a perspective view illustrating a stacked semiconductor device 3600 including a semiconductor memory device in accordance with embodiments of the inventive concepts. In the memory modules 3300, 3400, and 3500 of FIGS. 15 to 17, each of the semiconductor memory devices may include a plurality of semiconductor layers LA1 to LAn. Each of the semiconductor layers LA1 to LAn may include memory banks 3610.

In the stacked semiconductor device 3600, the plurality of stacked semiconductor layers LA1 to LAn may be connected to one another through through-silicon vias (TSVs) 3620.

Figure 19:
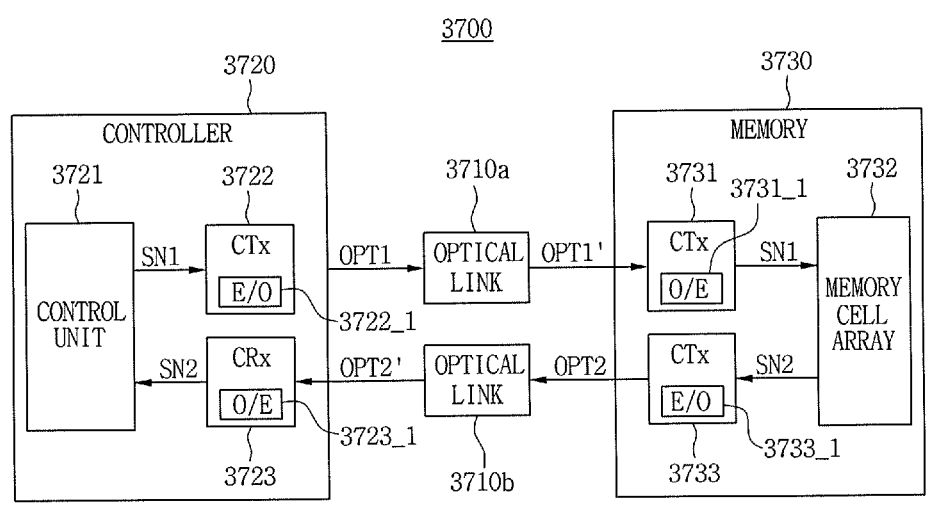
FIG. 19 is a block diagram of an example of a memory system including a semiconductor memory device and an optical link according to embodiments of the inventive concepts.

FIG. 19 is a block diagram of an example of a memory system 3700 including a semiconductor memory device and an optical link according to embodiments of the inventive concepts.

Referring to FIG. 19, the memory system 3700 includes a controller 3720, a semiconductor memory device 3730, and a plurality of optical links 3710a and 3710b configured to interconnect the controller 3720 and the semiconductor memory device 3730. The controller 3720 includes a control unit 3721, a first transmitter 3722, and a first receiver 3723. The control unit 3721 transmits a control signal SN1 to the first transmitter 3722.

The first transmitter 3722 may include a first optical modulator 3722_1. The first optical modulator 3722_1 converts the control signal SN1, which is an electric signal, into a first optical transmission signal OPT1, and transmits the first optical transmission signal OPT1 to the optical link 3710a.

The first receiver 3723 may include a first optical demodulator 3723_1. The first optical demodulator 3723_1 converts a second optical receiving signal OPT2', which is received from the optical link 3710b, into a data signal SN2 that is an electric signal, and transmits the data signal SN2 to the control unit 3721.

The semiconductor memory device 3730 includes a second receiver 3731, a memory cell array 3732, and a second transmitter 3733. The second receiver 3731 may include a second optical modulator 3731_1. The second optical modulator 3731_1 converts a first optical receiving signal OPT1', which is received from the optical link 3710a, into the control signal SN1 that is an electric signal, and transmits the control signal SN1 to the memory cell array 3732.

In the memory cell array 3732, responding to the control signal SN1, data is written, or the data signal SN2 output by the memory cell array 3732 is transmitted to the second transmitter 3733.

The second transmitter 3733 may include a second optical modulator 3733_1. The second optical modulator 3733_1 converts the data signal SN2, which is an electric signal, into a second optical data signal OPT2, and transmits the second optical data signal OPT2 to the optical link 3710b.

Though the semiconductor memory device and the system including an input receiver circuit are described in the above, example embodiments of the inventive concepts may be applied to arbitrary semiconductor devices including an input receiver circuit.

Embodiments of the inventive concepts may be applied to a semiconductor device, and particularly to a semiconductor memory device and a memory system including the semiconductor memory device.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. An input receiver circuit, comprising:
a first stage amplifier unit configured to amplify a single input signal in a single-to-differential mode to generate a differential output signal, without using a reference voltage; and
a second stage amplifier unit configured to amplify the differential output signal in a differential-to-single mode to generate a single output signal, wherein
the first stage amplifier unit includes:
a common-source amplifier configured to receive an input voltage signal at a gate terminal, amplify the input voltage signal, and output the amplified voltage signal from a drain terminal; and
a common-gate amplifier configured to receive the input voltage signal at a first terminal, amplify the input voltage signal, and output the amplified voltage signal from a second terminal.

2. The circuit according to claim 1, wherein the common-source amplifier includes a PMOS transistor configured to receive the input voltage signal at a gate terminal, and output the amplified voltage signal from a drain terminal.

3. The circuit according to claim 1, wherein the common-source amplifier includes an NMOS transistor configured to receive the input voltage signal at a gate terminal, and output the amplified voltage signal from a drain terminal.

4. The circuit according to claim 1, wherein the common-gate amplifier includes a PMOS transistor configured to have a gate terminal connected to a ground voltage, and receive the input voltage signal from a source terminal to output the amplified voltage signal to a drain terminal.

5. The circuit according to claim 1, wherein the common-gate amplifier comprises:
a PMOS transistor configured to have a gate terminal connected to a ground voltage, and receive the input voltage signal at a source terminal to output the amplified voltage signal from a drain terminal; and
an NMOS transistor configured to have a gate terminal connected to a supply voltage, and receive the input voltage signal at a drain terminal to output the amplified voltage signal from a source terminal.

6. The circuit according to claim 1, wherein the common-source amplifier includes:
a first PMOS transistor configured to receive an input voltage signal at a gate terminal, and amplify the input voltage signal to output a first output voltage signal from a drain terminal;
a current source configured to supply a current to a source terminal of the first PMOS transistor; and a first resistor connected between the drain terminal of the first PMOS transistor and a ground voltage, and configured to provide a load to the first PMOS transistor, and wherein the common-gate amplifier includes:

a second PMOS transistor configured to have a gate terminal connected to the ground voltage, and configured to receive the input voltage signal at a source terminal, and amplify the input voltage signal to output a second output voltage signal from a drain terminal; and a second resistor connected between the drain terminal of the second PMOS transistor and the ground voltage.

7. The circuit according to claim 1, wherein the common-source amplifier includes:

a first PMOS transistor configured to receive an input voltage signal at a gate terminal, and amplify the input voltage signal to output a first output voltage signal from a drain terminal;

a first current source configured to supply a current to a source terminal of the first PMOS transistor; and a second current source connected between the drain terminal of the first PMOS transistor and a ground voltage, and configured to provide a load to the first PMOS transistor, and wherein the common-gate amplifier includes:

a second PMOS transistor configured to have a gate terminal connected to the ground voltage, and configured to receive the input voltage signal at a source terminal to output a second output voltage signal from a drain terminal; and a third current source connected between the drain terminal of the second PMOS transistor and the ground voltage.

8. The circuit according to claim 1, wherein the common-source amplifier includes:

a first PMOS transistor configured to receive an input voltage signal at a gate terminal, and amplify the input voltage signal to output a first output voltage signal from a drain terminal;

a first current source configured to supply a current to a source terminal of the first PMOS transistor; and a resistor connected between the drain terminal of the first PMOS transistor and a ground voltage, and configured to provide a load to the first PMOS transistor, and wherein the common-gate amplifier includes:

a second PMOS transistor configured to have a gate terminal connected to a ground voltage, and configured to receive the input voltage signal at a source terminal to output a second output voltage signal from a drain terminal; and a second current source connected between the drain terminal of the second PMOS transistor and the ground voltage.

9. The circuit according to claim 1, wherein the common-source amplifier includes:

a first PMOS transistor configured to receive an input voltage signal at a gate terminal, and amplify the input voltage signal to output a first output voltage signal from a drain terminal;

a current source configured to supply a current to a source terminal of the first PMOS transistor; and a first resistor connected between the drain terminal of the first PMOS transistor and a ground voltage, and configured to provide a load to the first PMOS transistor, and wherein the common-gate amplifier includes:

a second PMOS transistor configured to have a gate terminal connected to a ground voltage, and configured to receive the input voltage signal at a source terminal to output a second output voltage signal from a drain terminal;

an NMOS transistor configured to have a gate terminal connected to a supply voltage, and configured to receive the input voltage signal at a drain terminal to output a second output voltage signal from a source terminal; and a second resistor connected between the drain terminal of the second PMOS transistor and the ground voltage.

10. The circuit according to claim 1, wherein the common-source amplifier includes:

an NMOS transistor configured to receive an input voltage signal at a gate terminal, and amplify the input voltage signal to output a first output voltage signal from a drain terminal;

a first resistor connected between a supply voltage and the drain terminal of the NMOS transistor; and a current source connected between a source terminal of the NMOS transistor and a ground voltage, and wherein the common-gate amplifier includes:

a PMOS transistor configured to have a gate terminal connected to a ground voltage, and configured to receive the input voltage signal at a source terminal to output a second output voltage signal from a drain terminal; and a second resistor connected between the drain terminal of the PMOS transistor and the ground voltage.

11. The circuit according to claim 1, wherein the common-source amplifier includes:

a first NMOS transistor configured to receive an input voltage signal at a gate terminal, and amplify the input voltage signal to output a first output voltage signal from a drain terminal;

a first resistor connected between a supply voltage and the drain terminal of the first NMOS transistor; and a current source connected between a source terminal of the first NMOS transistor and a ground voltage, and wherein the common-gate amplifier includes:

a PMOS transistor configured to have a gate terminal connected to a ground voltage, and configured to receive the input voltage signal at a source terminal to output a second output voltage signal from a drain terminal;

a second NMOS transistor configured to have a gate terminal connected to a supply voltage, and configured to receive the input voltage signal at a drain terminal to output a second output voltage signal from a source terminal; and a second resistor connected between the drain terminal of the PMOS transistor and the ground voltage.

12. The circuit according to claim 1, wherein the common-source amplifier includes:

an NMOS transistor configured to receive an input voltage signal at a gate terminal, and amplify the input voltage signal to output a first output voltage signal from a drain terminal;

a first current source connected between a supply voltage and the drain terminal of the NMOS transistor; and a second current source connected between a source terminal of the NMOS transistor and a ground voltage, and wherein the common-gate amplifier includes:

a PMOS transistor configured to have a gate terminal connected to a ground voltage, and configured to receive the input voltage signal at a source terminal to output a second output voltage signal from a drain terminal; and a third current source connected between the drain terminal of the PMOS transistor and the ground voltage.

13. The circuit according to claim 1, further comprising: a buffer unit configured to buffer the single output signal.

14. A semiconductor memory device, comprising:
a memory cell array configured to operate in response to a word-line enable signal and a column selecting signal;
a row decoder configured to decode a row address signal to generate the word-line enable signal;
a column decoder configured to decode a column address signal to generate the column selecting signal; and
an input/output circuit including an input receiver circuit, wherein the input receiver circuit includes:
a first stage amplifier unit configured to amplify a single input signal in a single-to-differential mode to generate a differential output signal, without using a reference voltage; and
a second stage amplifier unit configured to amplify the differential output signal in a differential-to-single mode to generate a single output signal, and wherein
the first stage amplifier unit includes:
a common-source amplifier configured to receive an input voltage signal at a gate terminal, amplify the input voltage signal, and output the amplified voltage signal from a drain terminal; and
a common-gate amplifier configured to receive the input voltage signal at a first terminal, amplify the input voltage signal, and output the amplified voltage signal from a second terminal.

15. The semiconductor memory device according to claim 14, wherein the common-source amplifier includes a PMOS transistor configured to receive the input voltage signal at a gate terminal, and output the amplified voltage signal from a drain terminal.

16. The semiconductor memory device according to claim 14, wherein the common-source amplifier includes an NMOS transistor configured to receive the input voltage signal at a gate terminal, and output the amplified voltage signal from a drain terminal.

17. The semiconductor memory device according to claim 14, wherein the common-gate amplifier includes a PMOS transistor configured to have a gate terminal connected to a ground voltage, and receive the input voltage signal from a source terminal to output the amplified voltage signal to a drain terminal.

18. The semiconductor memory device according to claim 14, wherein the common-gate amplifier comprises:
a PMOS transistor configured to have a gate terminal connected to a ground voltage, and receive the input voltage signal at a source terminal to output the amplified voltage signal from a drain terminal; and
an NMOS transistor configured to have a gate terminal connected to a supply voltage, and receive the input voltage signal at a drain terminal to output the amplified voltage signal from a source terminal.

\* \* \* \* \*